(12) United States Patent
Brockmeier et al.

(10) Patent No.: US 12,060,266 B2
(45) Date of Patent: Aug. 13, 2024

(54) METHOD WITH MECHANICAL DICING PROCESS FOR PRODUCING MEMS COMPONENTS

(71) Applicant: Infineon Technologies AG, Neubiberg (DE)

(72) Inventors: Andre Brockmeier, Villach (AT); Markus Bergmeister, St. Ulrich (AT); Bernhard Goller, Villach (AT); Daniel Pieber, Arnoldstein (AT); Sokratis Sgouridis, Annenheim (AT)

(73) Assignee: Infineon Technologies AG, Neubiberg (DE)

( * ) Notice: Subject to any disclaimer, the term of this patent is extended or adjusted under 35 U.S.C. 154(b) by 360 days.

(21) Appl. No.: 17/248,799

(22) Filed: Feb. 8, 2021

(65) Prior Publication Data
US 2021/0253421 A1 Aug. 19, 2021

(30) Foreign Application Priority Data

Feb. 13, 2020 (DE) .................... 102020103732.5

(51) Int. Cl.
*B81C 1/00* (2006.01)

(52) U.S. Cl.
CPC ...... *B81C 1/00896* (2013.01); *B81C 1/00047* (2013.01); *B81C 1/00119* (2013.01); *B81C 2201/053* (2013.01)

(58) Field of Classification Search
CPC ... B81C 1/00865–00904; B81C 2201/05–056; B81C 1/00896; H01L 21/6836; H01L 21/6835
See application file for complete search history.

(56) References Cited

U.S. PATENT DOCUMENTS

| | | | | |
|---|---|---|---|---|
| 5,824,177 A | * | 10/1998 | Yoshihara | H01L 21/78 438/464 |
| 6,572,944 B1 | | 6/2003 | Glenn et al. | |
| 2002/0076873 A1 | * | 6/2002 | Spooner | B81C 1/00896 438/200 |
| 2005/0156309 A1 | | 7/2005 | Fujii et al. | |
| 2011/0018076 A1 | * | 1/2011 | Pahl | B81B 7/0061 257/415 |

(Continued)

FOREIGN PATENT DOCUMENTS

| | | |
|---|---|---|
| DE | 19628237 A1 | 1/1997 |
| DE | 19957111 A1 | 5/2000 |
| JP | 2010272627 A | 12/2010 |

*Primary Examiner* — Shahed Ahmed
*Assistant Examiner* — Sun Mi Kim King
(74) *Attorney, Agent, or Firm* — Harrity & Harrity, LLP

(57) ABSTRACT

A method for producing MEMS components comprises generating a carrier having a plurality of recesses. An adhesive structure is arranged on the carrier and in the recesses. A semiconductor wafer is generated, which has a plurality of MEMS structures arranged at the first main surface of the semiconductor wafer. The adhesive structure is attached to the first main surface of the semiconductor wafer, with the recesses being arranged above the MEMS structures and the adhesive structure not contacting the MEMS structures. The semiconductor wafer is singulated into a plurality of MEMS components by applying a mechanical dicing process.

21 Claims, 7 Drawing Sheets

(56) References Cited

U.S. PATENT DOCUMENTS

2012/0309130 A1\* 12/2012 Hin .................... H01L 21/568
                                                                                                 257/E21.599
2015/0147850 A1\* 5/2015 Stranzl ............... H01L 21/6835
                                                                                                 438/118

\* cited by examiner

METHOD WITH MECHANICAL DICING PROCESS FOR PRODUCING MEMS COMPONENTS

CROSS REFERENCE TO RELATED APPLICATION

This application claims priority to German Patent Application No. 102020103732.5 filed on Feb. 13, 2020, the content of which is incorporated by reference herein in its entirety.

TECHNICAL SUBJECT AREA

The present disclosure relates to methods with a mechanical dicing process for producing MEMS components. In addition, the disclosure relates to MEMS components manufactured by such methods.

BACKGROUND

MEMS components can be produced at the wafer level, the wafer being singulated into multiple MEMS components after the MEMS structures have been formed. The MEMS structures can comprise sensitive, open structures, such as movable micromirrors among others. Stealth-dicing processes for the singulation of wafers into dies can be pushed to their limits with high substrate doping levels or high substrate thicknesses.

BRIEF DESCRIPTION

Various aspects relate to a method for producing MEMS components. The method comprises generating a carrier having a plurality of recesses. The method also comprises the arrangement of an adhesive structure on the carrier and in the recesses. The method also comprises generating a semiconductor wafer having a plurality of MEMS structures arranged on a first main surface of the semiconductor wafer. The method also comprises attaching the adhesive structure to the first main surface of the semiconductor wafer with the recesses being arranged above the MEMS structures and the adhesive structure not contacting the MEMS structures. The method also comprises singulating the semiconductor wafer into a plurality of MEMS components by applying a mechanical dicing process.

Various aspects relate to a method for producing MEMS components. The method comprises the arrangement of an adhesive structure on a main surface of a carrier. The method also comprises generating a semiconductor wafer having a plurality of MEMS structures arranged near a first main surface of the semiconductor wafer. The method also comprises attaching the adhesive structure to the first main surface of the semiconductor wafer, with the adhesive structure contacting the MEMS structures. The method also comprises singulating the semiconductor wafer into a plurality of MEMS components by applying a mechanical dicing process.

Various aspects relate to a MEMS component. The MEMS component comprises an open MEMS structure formed at a main surface of the MEMS component, wherein a thickness of the MEMS component in a direction perpendicular to the main surface is greater than 600 microns, wherein a specific electrical resistance of a semiconductor material of the MEMS component is less than 0.01 Ω·cm, and wherein the MEMS component is singulated by a mechanical dicing process along a side wall of the MEMS component.

BRIEF DESCRIPTION OF THE DRAWINGS

Methods and devices according to the disclosure are described in more detail in the following with the aid of drawings. The elements shown in the drawings are not necessarily reproduced true to scale relative to each other. Identical reference signs can refer to identical components.

DETAILED DESCRIPTION

The FIGS. described below show MEMS components and methods for producing such MEMS components according to the disclosure. In these, the methods and devices described may be shown in a general form, in order to describe aspects of the disclosure in qualitative terms. The methods and devices described may have other aspects, which for the sake of simplicity cannot be shown in the respective figure. However, each example may be extended by one or more aspects that are described in conjunction with other examples according to the disclosure. Thus, statements relating to a particular figure can apply equally to examples of other figures.

Figure 1A:
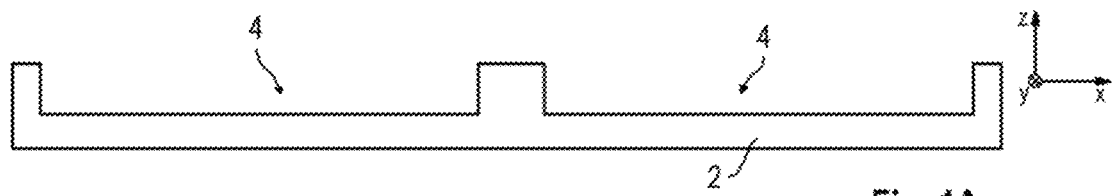
FIGS. 1A to 1J schematically show a method for manufacturing MEMS components according to the disclosure.

In the cross-sectional side view of FIG. 1A, a carrier 2 having a plurality of recesses (or wells or cavities) 4 can be provided. In the example of FIG. 1A, for the sake of simplicity only two recesses 4 are shown. In other examples, the carrier 2 can have any number of additional recesses 4 in the x- and/or y-direction. The number of recesses 4 can amount to several dozen or several hundred and can correspond to a typical number of MEMS components, or semiconductor dies with MEMS structures, formed on a semiconductor wafer. In the side view of FIG. 1A, the recesses 4 can have a rectangular shape. In other examples, the recesses 4 in side view may have a different shape, for example round or oval. In general, the carrier 2 can be fabricated from any material that can be easily structured. For example, the carrier 2 can be made of one or more of a glass material, a semiconductor material, or a metal. In particular, a material of the carrier 2 can have a good thermal conductivity and/or be permeable to UV radiation.

Figure 1B:
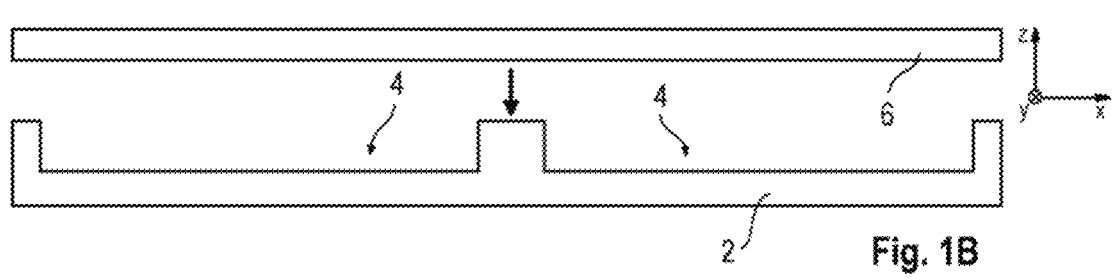

In the cross-sectional side view of FIG. 1B an adhesive structure 6 can be provided and arranged on the carrier 2 and in the recesses 4. In one example, the adhesive structure 6 can be a double-sided adhesive tape (or an adhesive foil or an adhesive film), which can have adhesive properties on its top and underside. The adhesive tape can be heat-soluble and/or UV-soluble, in order to be easily removed from the carrier 2 in a later method step. In another example, the adhesive structure 6 can be an adhesive that can be arranged on the carrier 2 and in the recesses 4, for example using a spray procedure and/or a spin-on procedure. The adhesive can be in particular UV-soluble, so that it can be detached from the carrier 2 again under the action of UV radiation. In the example of FIG. 1B, the adhesive structure 6 can be configured as a single part. In other examples, the adhesive structure 6 can have a multi-part design, wherein the multiple parts of the adhesive structure 6 can be at least partially arranged in the recesses 4 of the carrier 2.

Figure 1C:
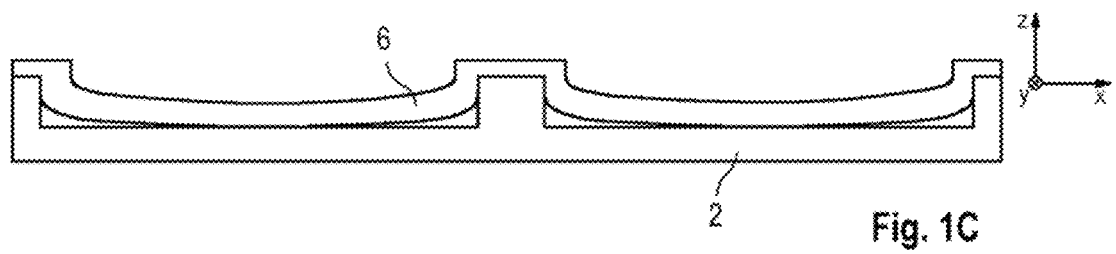

The cross-sectional side view of FIG. 1C shows the adhesive structure 6 arranged on the top of the carrier 2. In the example of FIG. 1C, the adhesive structure 6, after being arranged on the carrier 2, can completely cover the base surfaces of the recesses 4 and sections of the carrier 2 between the recesses 4. In other examples, the base surfaces and intermediate sections may be only partially covered by the adhesive structure 6. In the example of FIG. 1C, the adhesive structure 6 can directly mechanically contact the base surfaces of the recesses 4. In other examples, the base surfaces may be covered by the adhesive structure 6, but they do not necessarily directly mechanically contact them. For example, the carrier 2 with the adhesive structure 6 can be laminated under vacuum, wherein the adhesive structure 6 can be drawn into the recesses 4 due to the vacuum. Whether or not the adhesive structure 6 directly mechanically contacts the base surfaces of the recesses 4 after the lamination can depend on the strength of the vacuum, the flexibility of the adhesive structure 6 and/or the depth of the recesses 4.

Figure 1D:
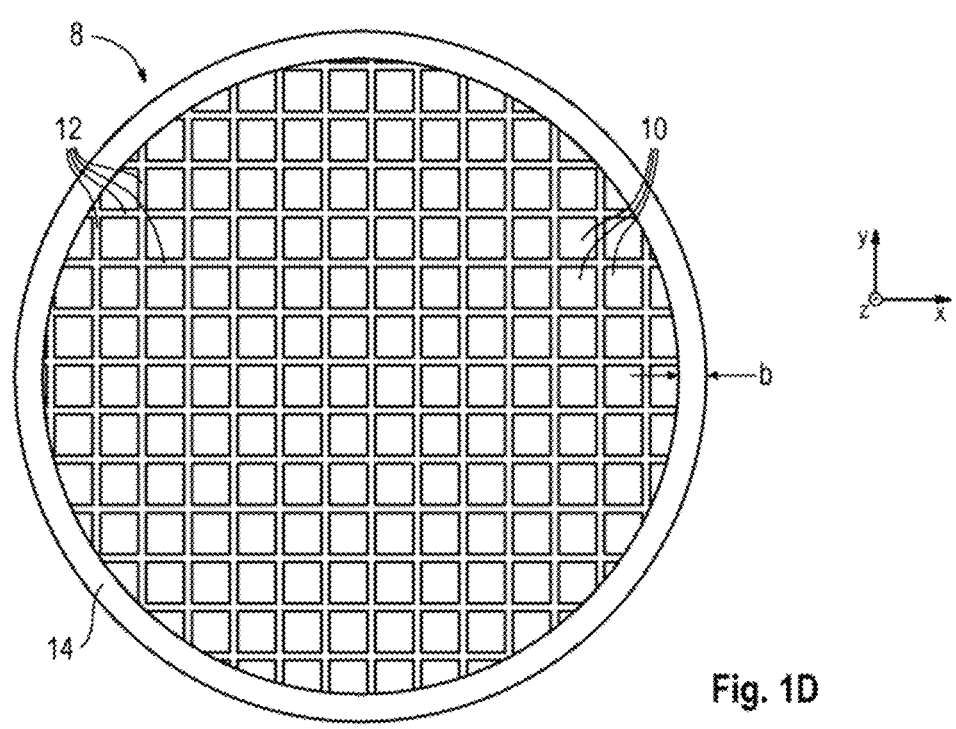

In the plan view of FIG. 1D, a semiconductor wafer 8 can be provided which can be fabricated from any semiconductor material, in particular silicon. The semiconductor wafer 8 can have a plurality of semiconductor dies (or semiconductor chips) 10, wherein the number of semiconductor dies 10 can be several dozen or several hundred. In particular, the number of semiconductor dies 10 can essentially correspond to the number of recesses 4 in the carrier 2. A detailed structure of the semiconductor dies 10 is not shown in the plan view of FIG. 1D, for the sake of simplicity. In the example of FIG. 1D, the semiconductor wafer 8 can be circular. In other examples, the semiconductor wafer 8 can correspond to a semiconductor panel and have a rectangular shape. On the surface of the semiconductor wafer 8 shown, sawing lines (or scoring lines) 12 can be formed, along which the semiconductor wafer 8 can be singulated into the semiconductor dies 10 in a later mechanical dicing process. In FIG. 1D, the sawing lines 12 can form a rectangular grid structure, as an example.

A thickness of the semiconductor wafer 8 in the z-direction can be greater than approximately 600 microns, more precisely greater than approximately 650 microns, more precisely greater than approximately 700 microns, more precisely greater than approximately 750 microns, more precisely greater than approximately 800 microns, more precisely greater than approximately 850 microns, and even more precisely, greater than approximately 900 microns. A specific electrical resistance of the semiconductor wafer 8 can be less than approximately 0.01 Ω·cm, more precisely less than approximately 0.005 Ω·cm, and even more precisely, less than approximately 0.001 Ω·cm. A width of the sawing lines 12 (kerf width) of the semiconductor wafer 8 can be less than approximately 240 microns, more precisely less than approximately 200 microns, and even more precisely less than approximately 160 microns. A ratio of a kerf width of the semiconductor wafer 8 to a thickness of the semiconductor wafer 8 in the z-direction can be less than approximately 0.4, more precisely less than approximately 0.3, and even more precisely, less than approximately 0.2.

The semiconductor wafer 8 can have an edge region 14 without sawing lines 12. This edge region 14 may be excluded from a later mechanical dicing process. In the example of FIG. 1D, the edge region 14 can enclose an interior of the semiconductor wafer 8 completely and without interruption. In other examples, the edge region 14 may be interrupted one or more times by one or more of the sawing lines 12. The edge region 14 without sawing lines 12 can be annular in shape and have a width "b". The width "b" can have any value in a range from approximately 2 mm to approximately 10 mm. In the example of FIG. 1D, the width "b" of the edge region 14 can be substantially constant. In other examples, the width "b" can vary along the edge region 14.

Figure 1E:
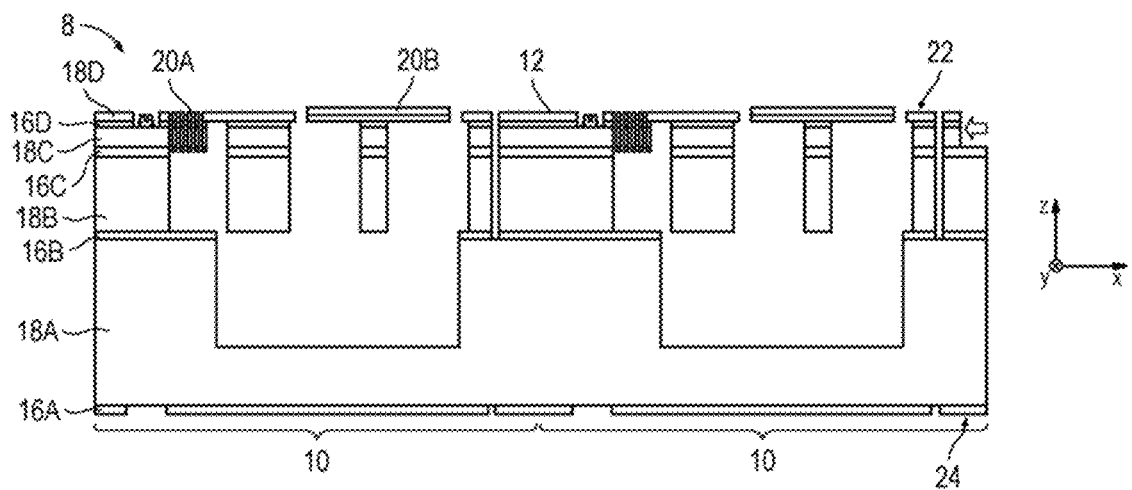

In the cross-sectional side view of FIG. 1E, an internal structure of the semiconductor wafer 8 is shown qualitatively. The semiconductor wafer 8 can be fabricated based on an SOI (Silicon on Substrate) technology, and in this case can be composed of a plurality of dielectric layers 16A-16D and semiconductor material layers 18A-18D arranged on top of one another. The semiconductor material layers 18A-18D can have different doping values. For the sake of simplicity, FIG. 1E shows only two semiconductor dies 10 of the semiconductor wafer 8. Each semiconductor die 10 can have one or more MEMS (micro-electromechanical system) structures that can be integrated into the semiconductor die 10. The semiconductor devices 10, which are subsequently singulated, can therefore also be configured as MEMS components. Quite generally, the MEMS structures of the semiconductor dies 10 can be any micromechanical structures, such as bridges, membranes, beams, cantilevers, tongue structures, comb structures, movable micromirrors, etc.

In the example of FIG. 1E, each semiconductor die 10 can have two MEMS structures 20A, 20B, which can be arranged near the upper main surface or front side 22 of the semiconductor wafer 8. The lower main surface or rear side 24 of the semiconductor wafer 8 can be continuously closed, e.g. the MEMS structures 20A, 20B can only be accessed via the front side 22 of the semiconductor wafer 8. The MEMS structure 20A can be a capacitive comb structure, and the MEMS structure 20B can be a movable micromirror. In one example, the MEMS components to be produced from the semiconductor wafer 8 can be LIDAR (Light Detection and Ranging) sensor components, such as those which can be used in fully autonomous or partially autonomous self-driving cars, for example. The mobile MEMS micromirror 20B may be configured to oscillate about a scan axis, so that light that is reflected from the MEMS micromirror 20B and used for scanning the environment will oscillate back and forth.

Figure 1F:
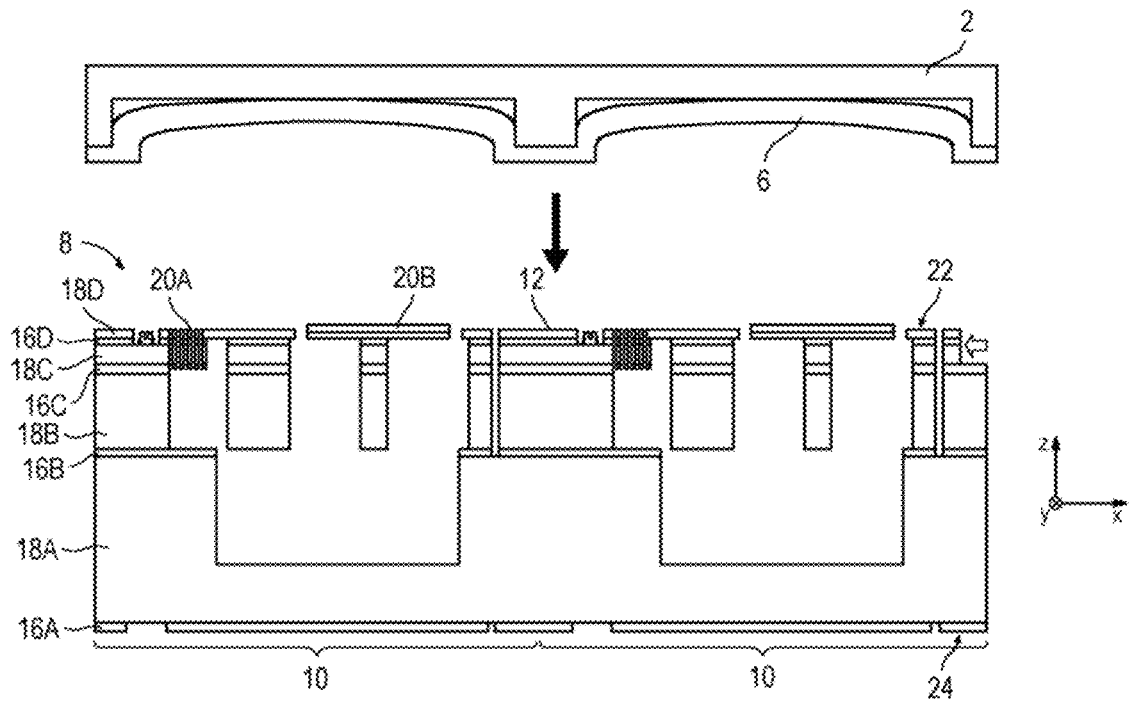

In the cross-sectional side view of FIG. 1F the adhesive structure 6 and the carrier 2 can be attached to the front side 22 of the semiconductor wafer 8. The recesses 4 can be arranged above the MEMS structures 20A, 20B. In particular, each recess 4 can be arranged above one of the semiconductor dies 10 and thereby cover the MEMS structures 20A, 20B of the respective semiconductor die 10. The adhesive structure 6 cannot contact the MEMS structures 20A, 20B, so that the open MEMS structures 20A, 20B also remain uncovered. This means that the MEMS structures 20A, 20B cannot be damaged by the adhesive structure 6 or its subsequent removal. Before the adhesive structure 6 is attached to the semiconductor wafer 8, the two components can be aligned relative to each other in a suitable manner, for example by using optical markers which may be arranged on and/or in the carrier 2 and/or the adhesive structure 6 and/or the semiconductor wafer 8.

Figure 1G:
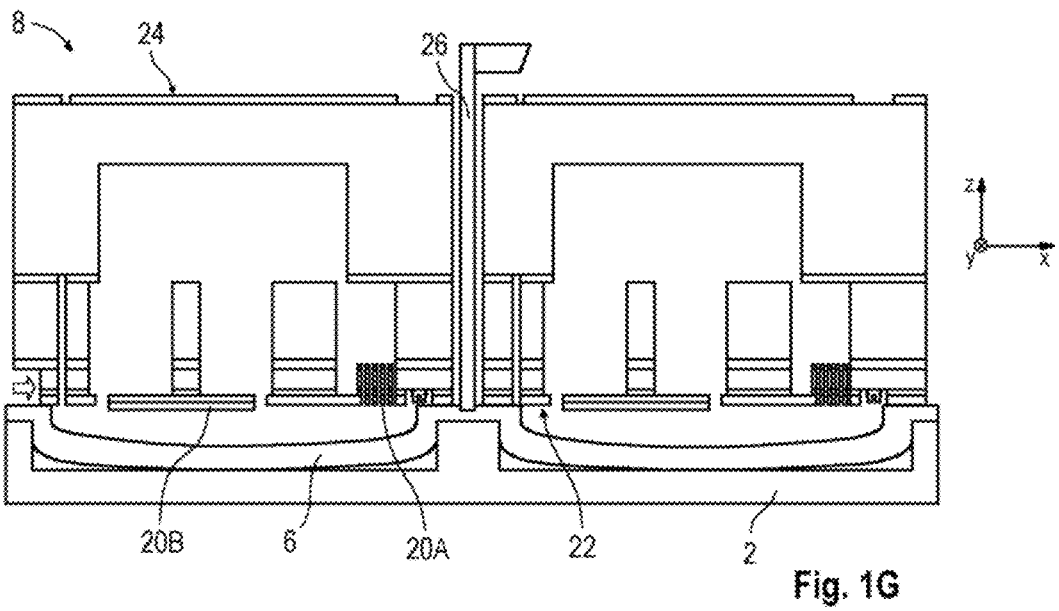

In the cross-sectional side view of FIG. 1G, the arrangement of FIG. 1F can first be inverted. The semiconductor wafer 8 can then be singulated into a plurality of semiconductor dies 10 or into a plurality of MEMS components by the application of a mechanical dicing process. In particular, the mechanical dicing process can comprise a sawing process, wherein the semiconductor wafer 8 can be singulated using a saw blade 26, starting from the rear side 24 of the semiconductor wafer 8. In the example of FIG. 1G, the mechanical dicing process can be applied from the rear side 24 of the semiconductor wafer 8. In other examples, the mechanical dicing process can be applied from the front side 22 of the semiconductor wafer 8, e.g. the saw blade 26 can singulate the semiconductor wafer 8 starting from the front side 22. In the example of FIG. 1G, the adhesive structure 6 and the carrier 2 can be excluded from the mechanical dicing process, e.g. they are not damaged by the saw blade 26. The carrier 2 with the adhesive structure 6 arranged thereon can thus be reused for singulating another semiconductor wafer (not shown). In another example, at least the adhesive structure 6 can be singulated or damaged by the saw blade 26, so that only the carrier 2 can be reused for a further singulation process.

Figure 1H:
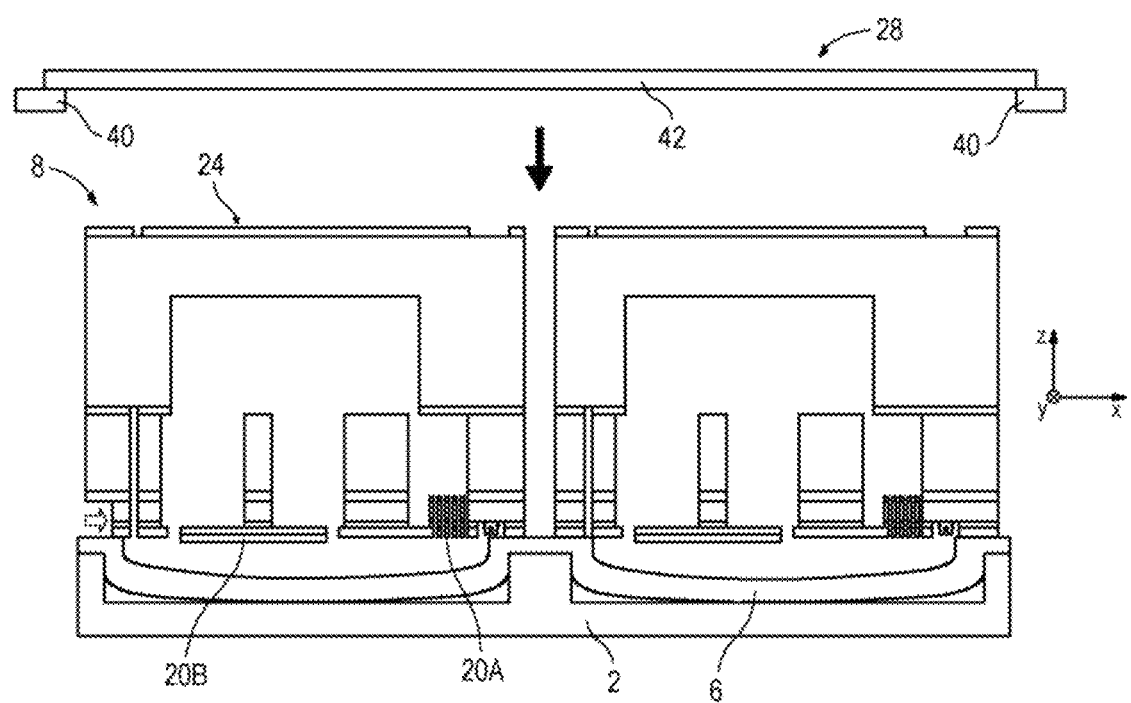

In the cross-sectional side view of FIG. 1H, the singulated arrangement with the rear side 24 of the semiconductor wafer 8 can be arranged on a carrier 28. The carrier 28 can be, in particular, a tape-and-frame carrier, which can have a film 42 stretched over a frame 40.

Figure 1I:
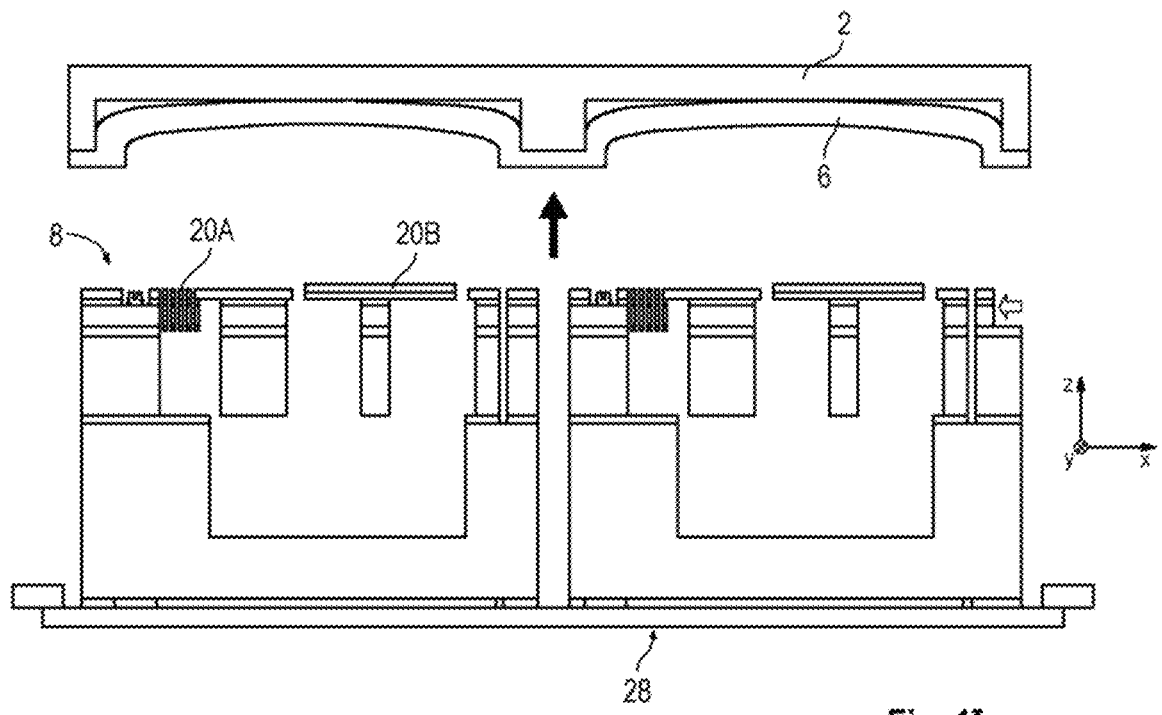

In the cross-sectional side view of FIG. 1I, the arrangement of FIG. 1H can first be inverted. Then, the arrangement, and in particular the adhesive structure 6, can be subjected to heat treatment and/or UV treatment. By using such a treatment, the adhesive structure 6 can at least partially lose its adhesive properties, so that the adhesive structure 6 and the carrier 2 can be removed from the semiconductor wafer 8. In an example of a heat treatment process, the carrier 2 can be placed on a heated chuck (not shown).

Figure 1J:
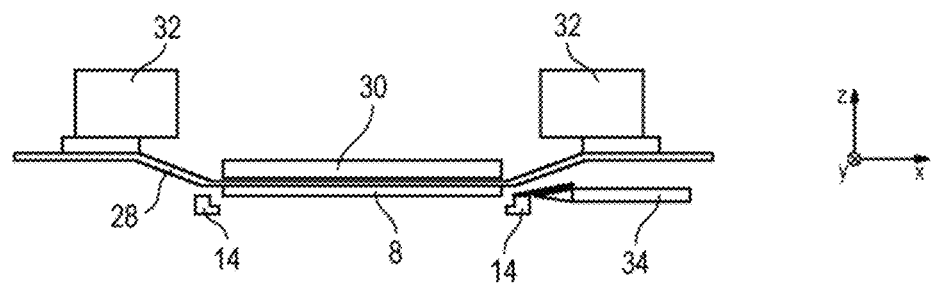

In the cross-sectional side view of FIG. 1J, the edge region 14 of the semiconductor wafer 8 can be separated from the rest of the semiconductor wafer 8. The carrier 28 with the semiconductor wafer 8 arranged on it can be arranged on a (heatable) wafer chuck 30. In addition, the edge of the carrier 28 can be placed on a pretension chuck 32. The pretension chuck 32 can be configured to lift the edge of the carrier 28 in the z-direction. The edge region 14 of the semiconductor wafer 8 can then be separated from the rest of the semiconductor wafer 8 and detached from the carrier 28 with the aid of a blade 34.

In further process steps (not shown) the carrier 28 can be expanded in the x-y plane, so that the individual semiconductor dies 10 can be further spatially separated from each other. The separate semiconductor dies 10 can then be removed from the carrier 28 by a pick-and-place process and possibly further processed in additional process steps.

FIGS. 2A to 2D shows a further method for producing MEMS components according to the disclosure. The components shown in FIGS. 2A to 2D can be at least partially similar to corresponding components of FIGS. 1A to 1J and have similar properties, so that reference is made to corresponding statements in relation to FIGS. 1A to 1J.

Figure 2A:
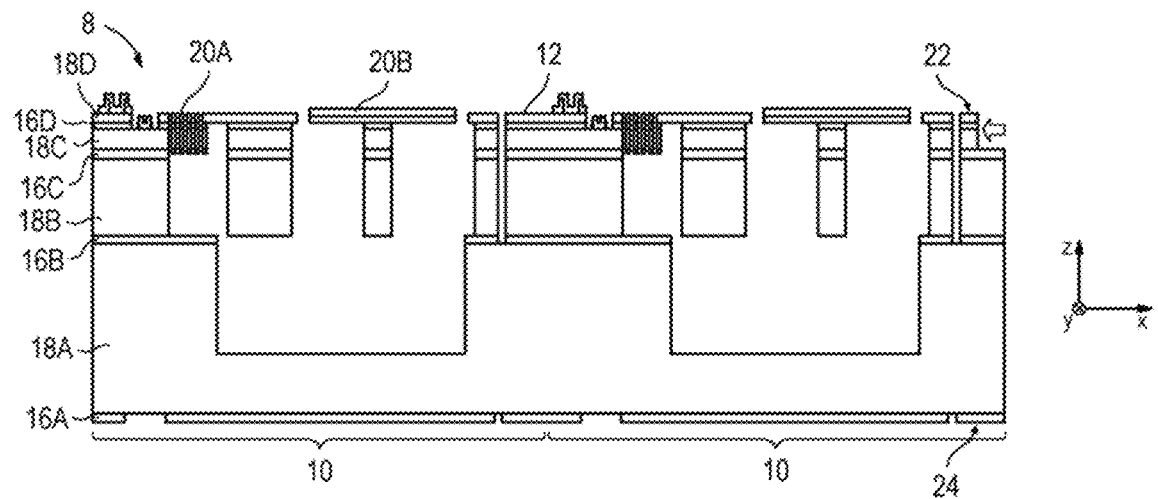
FIGS. 2A to 2D show a schematic, cross-sectional side view of a method for producing MEMS components according to the disclosure.

In FIG. 2A a semiconductor wafer 8 can be provided. The semiconductor wafer 8 can comprise a plurality of semiconductor dies 10, each with a plurality of MEMS structures 20A, 20B each, which can be arranged near the front side 22 of the semiconductor wafer 8.

Figure 2B:
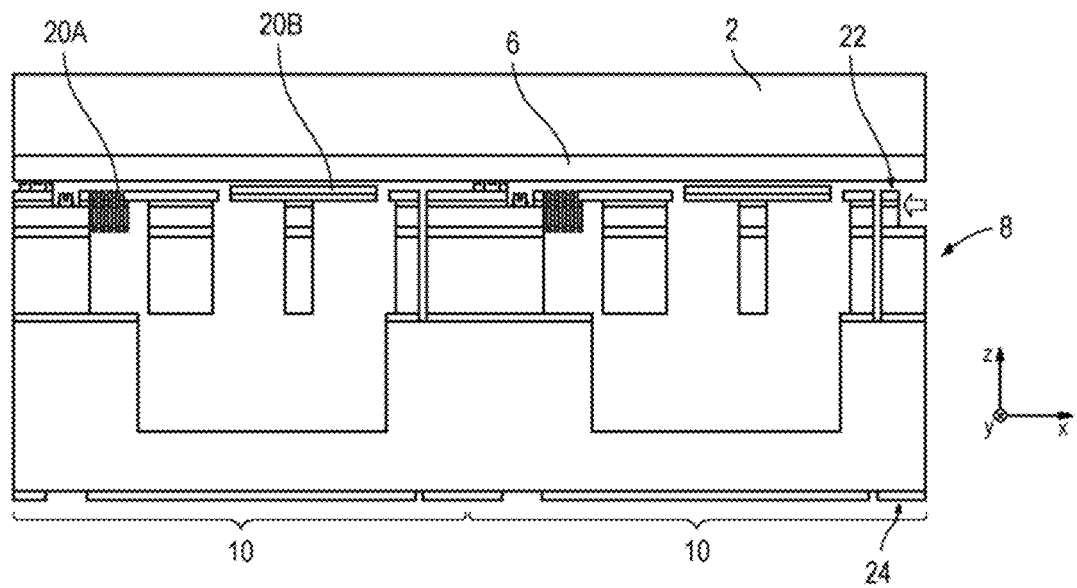

In FIG. 2B an adhesive structure 6 can firstly be arranged on a main surface of a carrier 2. The main surface of the carrier 2 in this case can be configured substantially planar. The adhesive structure 6 and the carrier 2 can then be attached to the front side 22 of the semiconductor wafer 8, wherein the adhesive structure 6 can mechanically contact the MEMS structures 20A, 20B (in particular directly). In FIG. 2B, a direct mechanical contact between the adhesive structure 6 and the MEMS structures 20A, 20B is not explicitly shown for clarity of presentation.

Figure 2C:
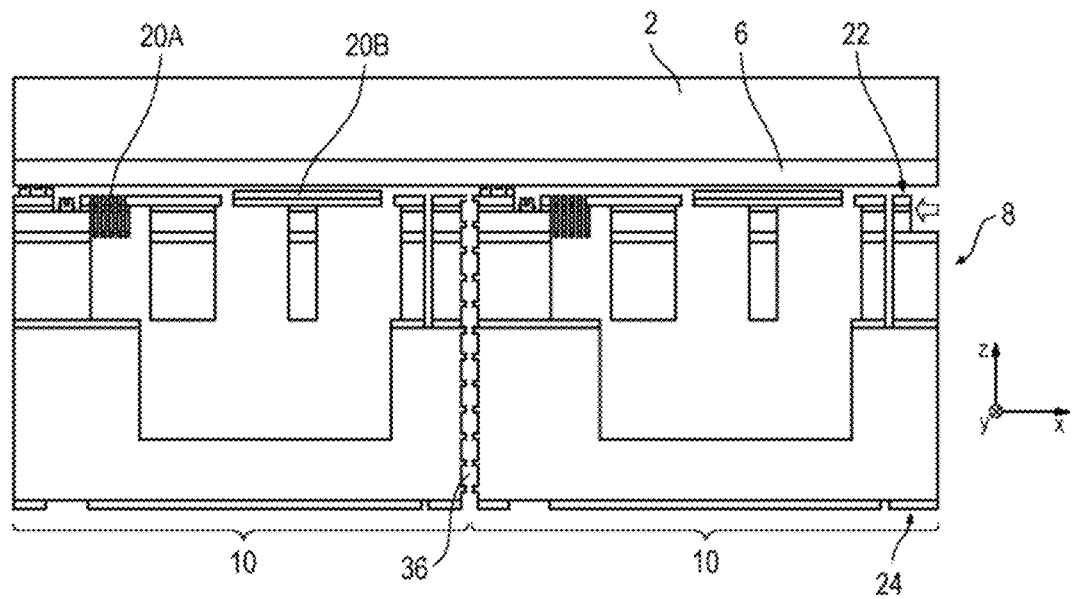

In FIG. 2C the semiconductor wafer 8 can be singulated into a plurality of semiconductor dies 10 or a plurality of MEMS components by the application of a mechanical dicing process. The mechanical dicing process can comprise a sawing process, wherein the semiconductor wafer 8 can be singulated using a saw blade (not shown) starting from the rear side 24 of the semiconductor wafer 8. In the example of FIG. 2C, the mechanical dicing process can be applied from the rear side 24 of the semiconductor wafer 8. In other examples, the mechanical dicing process can be applied from the front side 22 of the semiconductor wafer 8. FIG. 2C shows the semiconductor dies 10 after singulation, e.g. the semiconductor dies 10 can already be separated from each other by a material-free region 36. In the example of FIG. 2C, the adhesive structure 6 and the carrier 2 can be excluded from the mechanical dicing process and therefore reused for singulating a further semiconductor wafer (not shown). In another example, only the adhesive structure 6 can be singulated or damaged by the dicing process, so that at least the carrier 2 can be used for a further singulation process.

Figure 2D:
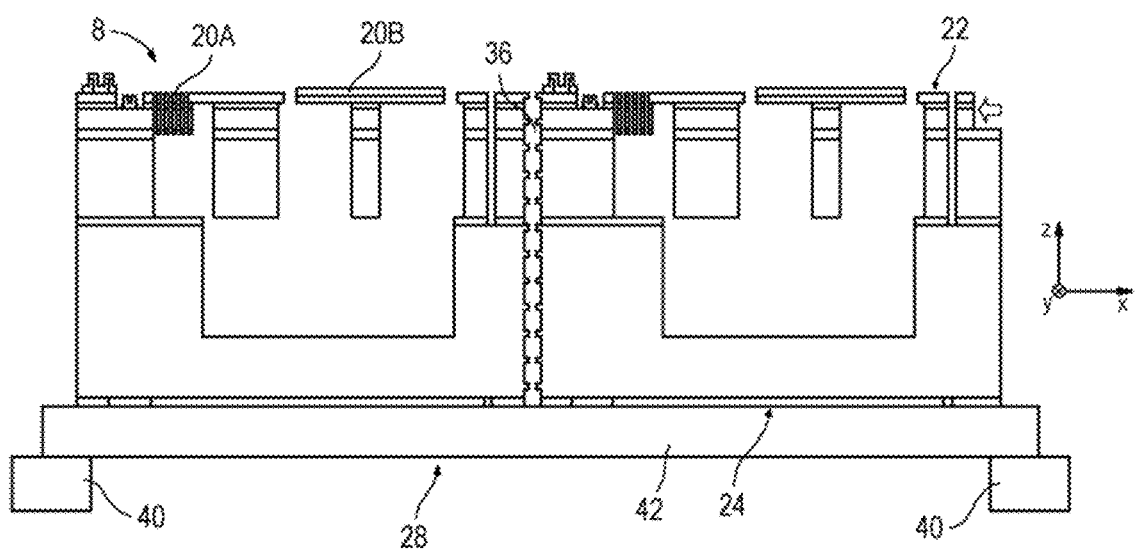

In FIG. 2D, the adhesive structure 6 can be subjected to heat treatment and/or UV treatment. Using this treatment, the adhesive structure 6 can at least partially lose its adhesive properties, so that the adhesive structure 6 and the carrier 2 can be removed from the semiconductor wafer 8. In a further step, the semiconductor wafer 8 can be arranged with its rear side 24 on a carrier 28, in particular a tape-and-frame carrier.

The arrangement of FIG. 2D can be further processed in additional steps. For example, in a further step (not shown) an edge region of the semiconductor wafer 8 can be separated from the semiconductor wafer 8 (see FIG. 1J). In addition, the carrier 28 can be expanded in the x-y plane, wherein the already singulated semiconductor dies 10 can be further spatially separated from each other. The separate semiconductor dies 10 can then be removed from the carrier 28 by a pick-and-place process.

Figure 3:
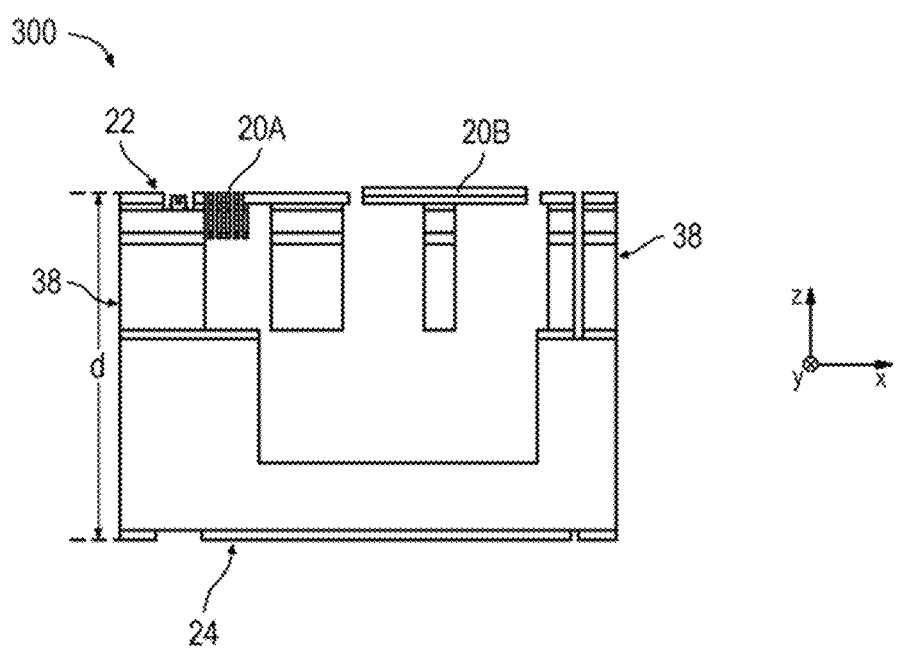
FIG. 3 shows a cross-sectional side view of a MEMS component 300 according to the disclosure.

The MEMS component 300 of FIG. 3, for example, can be produced according to one of the methods of FIGS. 1 and 2. The MEMS component 300 can have a first main surface or front side 22 and a second main surface or rear side 24. The front side 22 and the rear side 24 of the MEMS component 300 can be connected by one or more side walls 38. The MEMS component 300 can have one or more open (or unencapsulated or not hermetically encapsulated) MEMS structures 20A, 20B formed at the front side 22.

The MEMS component 300 can have similar properties with regard to its thickness and its specific electrical resistance to the semiconductor wafer 8 described in FIGS. 1 and 2. In particular, a thickness "d" of the MEMS component 300 in a direction perpendicular to the front side 22 can be greater than approximately 600 microns. In the example of FIG. 3, the thickness "d" can be measured along the z-direction. In addition, a specific electrical resistance of a semiconductor material of the MEMS component 300 can be, in particular, less than approximately 0.01 $\Omega \cdot cm$.

The MEMS component 300 can be singulated along one or more of the side walls 38 by a mechanical dicing process. In the singulation of a semiconductor wafer 8 by a mechanical dicing process, in particular by a sawing process, the side walls of the singulated semiconductor dies can have a typical structure. Semiconductor dies that have been singulated by other singulation processes, such as stealth dicing or laser cutting, may have sidewall structures different to this. The technique used for singulating a semiconductor wafer can be identified by, for example, an optical-microscopic analysis of the chip side walls.

The technical features of the methods and devices according to the disclosure described in FIGS. 1 to 3 can provide the technical effects described below.

The sensitive MEMS structures 20A, 20B can be protected from damage during the mechanical dicing process due to their arrangement in the recesses 4. For example, the MEMS structures 20A, 20B can be protected from vibrations of the saw blade 26, cooling water and/or particle contamination by saw slurry.

In the methods described herein, protection of the MEMS structures 20A, 20B does not necessarily have to be provided by complete and possibly permanent encapsulation of the MEMS structures 20A, 20B at the wafer level. Instead, the MEMS structures 20A, 20B can be protected by a temporary arrangement in the recesses 4. After the mechanical dicing process and the removal of the adhesive structure 6 and the carrier 2, the MEMS structures 20A, 20B may be left undamaged and unencapsulated. The methods of FIGS. 1 and 2 can therefore be particularly suitable for producing MEMS components with open (or non-encapsulated or non-hermetically encapsulated) MEMS structures 20A, 20B.

Semiconductor wafers with specific properties are sometimes not able to be singulated easily using conventional singulation techniques. In particular, the singulation of such semiconductor wafers using a stealth-dicing process can be problematic. In one example, a stealth-dicing process in a semiconductor wafer with a specific electrical resistance in a range from approximately 0.01 $\Omega \cdot cm$ to approximately 1 $\Omega \cdot cm$ can cause damage to a depth of only approximately 160 microns. This means that stealth-dicing processes may be unsuitable for the singulation of semiconductor wafers with larger substrate thicknesses. In contrast, the methods described herein can be substantially independent of the wafer substrate thickness. In another example, with a kerf width of less than approximately 240 microns, a laser used in a stealth-dicing process cannot adequately couple into the scoring lines on the wafer surface. This means that a stealth-dicing process may not be suitable for the singulation of semiconductor wafers with a kerf width of less than about 240 microns. In contrast, the methods described here can be used with such kerf widths.

According to the above comments, the methods described herein can thus provide in particular an efficient production of MEMS components from highly-doped, thick semiconductor wafers with open (or unencapsulated or non-hermetically encapsulated) MEMS structures, without the sensitive MEMS structures being damaged during the singulation process.

In the method of FIGS. 1A to 1J, the MEMS structures 20A, 20B cannot come into contact with the adhesive structure 6 at any time. Thus, damage to the MEMS structures 20A, 20B by the adhesive structure 6 or when removing the adhesive structure 6 can be avoided. In particular, deflection of the MEMS structures 20A, 20B in the z-direction can be avoided. In addition, in the method of FIGS. 1A to 1J an additional cleaning step can be omitted, as due to the lack of direct mechanical contact, no residues of the adhesive structure 6 remain on the MEMS structures 20A, 20B.

In the methods of FIGS. 1 and 2, the edge region 14 of the semiconductor wafer 8 can be excluded from the mechanical dicing process. This can prevent semiconductor dies 10 at the edge of the semiconductor wafer from becoming detached during the mechanical dicing process. Such detached semiconductor dies 10 can strike the saw blade 26 and damage it as a result. A damaged saw blade 26 can lead to inhomogeneous sawing results, in particular to an offset of the saw edges and/or damage and/or breaking away of the die edges (chipping). In addition, detached semiconductor dies 10 can lead to contamination of the front sides of adjacent semiconductor dies 10.

EXAMPLES

In the following, MEMS components and methods for producing such MEMS components will be explained using examples.

Example 1 is a method for producing MEMS components, comprising: generating a carrier having a plurality of recesses; arranging an adhesive structure on the carrier and in the recesses; generating a semiconductor wafer having a plurality of MEMS structures arranged near a first main surface of the semiconductor wafer; attaching the adhesive structure to the first main surface of the semiconductor wafer, with the recesses being arranged above the MEMS structures and the adhesive structure not contacting the MEMS structures; and singulating the semiconductor wafer into a plurality of MEMS components by application of a mechanical dicing process.

Example 2 is a method according to example 1, wherein the mechanical dicing process is applied at a second main surface of the semiconductor wafer, which is opposite to the first main surface.

Example 3 is a method according to example 1 or 2, wherein the adhesive structure is a double-sided adhesive tape.

Example 4 is a method according to example 3, wherein the adhesive tape is one or more of heat-soluble or UV-soluble.

Example 5 is a method according to one of the preceding examples, wherein the adhesive structure is configured as a single part.

Example 6 is a method according to one of the preceding examples, wherein the adhesive structure covers base surfaces of the recesses and sections of the carrier between the recesses.

Example 7 is a method according to one of the preceding examples, wherein the arrangement of the adhesive structure on the carrier and in the recesses comprises: laminating the carrier with the adhesive structure under vacuum.

Example 8 is a method according to one of the preceding examples, wherein the mechanical dicing process comprises a sawing process.

Example 9 is a method according to one of the preceding examples, wherein one or more of the carrier or the adhesive structure is excluded from the mechanical dicing process.

Example 10 is a method according to one of the preceding examples, wherein an edge region of the semiconductor wafer is excluded from the mechanical dicing process.

Example 11 is a method according to example 10, wherein the edge region is annular in shape and has a width in a range from 2 mm to 10 mm.

Example 12 is a method according to one of the preceding examples, wherein the second main surface of the semiconductor wafer is continuously closed.

Example 13 is a method according to one of the preceding examples, wherein a thickness of the semiconductor wafer in a direction perpendicular to the first main surface is greater than 600 microns.

Example 14 is a method according to one of the preceding examples, wherein a specific electrical resistance of the semiconductor wafer is less than 0.01 Ω·cm.

Example 15 is a method according to one of the preceding examples, wherein a kerf width of the semiconductor wafer is less than 240 microns.

Example 16 is a method according to one of the preceding examples, where a ratio of a kerf width of the semiconductor wafer to a thickness of the semiconductor wafer is less than 0.4.

Example 17 is a method according to one of the preceding examples, wherein the carrier is fabricated from one or more of a glass material or a semiconductor material.

Example 18 is a method according to one of the preceding examples, wherein the MEMS structures comprise movable micromirrors.

Example 19 is a method according to one of the preceding examples, further comprising: after the singulation of the semiconductor wafer, removal of the carrier and the adhesive structure using one or more of a heat treatment or a UV treatment of the adhesive structure.

Example 20 is a method for producing MEMS components, comprising: arranging an adhesive structure on a main surface of a carrier; generating a semiconductor wafer having a plurality of MEMS structures which are arranged near a first main surface of the semiconductor wafer; attaching the adhesive structure to the first main surface of the semiconductor wafer, wherein the adhesive structure contacts the MEMS structures; and singulating the semiconductor wafer into a plurality of MEMS components by application of a mechanical dicing process.

Example 21 is a method according to example 20, wherein the mechanical dicing process is applied at a second main surface of the semiconductor wafer, which is opposite to the first main surface.

Example 22 is a method according to example 20 or 21, wherein the main surface of the carrier is configured substantially planar.

Example 23 is a MEMS component, comprising: an open MEMS structure formed at a main surface of the MEMS component, wherein a thickness of the MEMS component in a direction perpendicular to the main surface is greater than 600 microns, wherein a specific electrical resistance of a semiconductor material of the MEMS component is less than 0.01 Ω·cm, and wherein the MEMS component is singulated by a mechanical dicing process along a side wall of the MEMS component.

Although specific implementations have been illustrated and described herein, it is obvious to the person skilled in the art that a plurality of alternative and/or equivalent implementations can replace the specific implementations shown and described, without departing from the scope of the present disclosure. This application is intended to include all modifications or variations of the specific implementations discussed herein. It is therefore intended that this disclosure is limited only by the claims and their equivalents.

The invention claimed is:

1. A method for producing micro-electromechanical system (MEMS) components, comprising:
   forming a carrier having a plurality of recesses;
   arranging an adhesive structure on the carrier and in the plurality of recesses;
   forming a semiconductor wafer having a plurality of MEMS structures arranged near a first main surface of the semiconductor wafer;
   attaching the adhesive structure to the first main surface of the semiconductor wafer, with the plurality of recesses being arranged above the plurality of MEMS structures and the adhesive structure not contacting the plurality of MEMS structures;
   singulation of the semiconductor wafer into a plurality of MEMS components by applying a mechanical dicing process such that the semiconductor wafer has a singulated arrangement corresponding to the plurality of MEMS components;
   after the singulation of the semiconductor wafer, arranging a second main surface of the semiconductor wafer having the singulated arrangement on a tape-and-frame carrier such that the plurality of MEMS components are arranged on the tape-and-frame carrier, wherein the second main surface is located opposite to the first main surface;
   after arranging the second main surface of the semiconductor wafer having the singulated arrangement on the tape-and-frame carrier, removing the carrier and the adhesive structure from the plurality of MEMS components using one or more of a heat treatment or a UV treatment of the adhesive structure; and
   after removing the carrier and the adhesive structure from the plurality of MEMS components:
     arranging the tape-and-frame carrier with the plurality of MEMS components on a wafer chuck;
     arranging an edge of the tape-and-frame carrier on a pretension chuck, wherein the pretension chuck is configured to lift the edge of the tape-and-frame carrier relative to an inner region of the tape-and-frame carrier that is coupled to the wafer chuck; and
   separating an edge region of the semiconductor wafer from the semiconductor wafer such that the edge region of the semiconductor wafer is detached from the tape-and-frame carrier.

2. The method as claimed in claim 1, wherein the mechanical dicing process is applied at the second main surface of the semiconductor wafer located opposite to the first main surface.

3. The method as claimed in claim 1, wherein the adhesive structure comprises a double-sided adhesive tape.

4. The method as claimed in claim 3, wherein the double-sided adhesive tape is heat-soluble or UV-soluble or both.

5. The method as claimed in claim 1, wherein the adhesive structure is configured as a single part.

6. The method as claimed in claim 1, wherein the adhesive structure covers base surfaces of the plurality of recesses and sections of the carrier between the plurality of recesses.

7. The method as claimed in claim 1, wherein the arranging of the adhesive structure on the carrier and in the plurality of recesses comprises:
   laminating the carrier with the adhesive structure under vacuum.

8. The method as claimed in claim 1, wherein the mechanical dicing process comprises a sawing process.

9. The method as claimed in claim 1, wherein one or more of the carrier or the adhesive structure is excluded from the mechanical dicing process, wherein at least the carrier is excluded from the mechanical dicing process.

10. The method as claimed in claim 1, wherein an edge region of the semiconductor wafer is excluded from the mechanical dicing process.

11. The method as claimed in claim 10, wherein the edge region is annular in shape and has a width in a range from 2 mm to 10 mm.

12. The method as claimed in claim 1, wherein the second main surface of the semiconductor wafer is continuously closed.

13. The method as claimed in claim 1, wherein a thickness of the semiconductor wafer in a direction perpendicular to the first main surface is greater than 600 microns.

14. The method as claimed in claim 1, wherein a specific electrical resistance of the semiconductor wafer is less than 0.01 Ω·cm.

15. The method as claimed in claim 1, wherein a kerf width of the semiconductor wafer is less than 240 microns.

16. The method as claimed in claim 1, wherein a ratio of a kerf width of the semiconductor wafer to a thickness of the semiconductor wafer is less than 0.4.

17. The method as claimed in claim 1, wherein the carrier is made of one or more of a glass material or a semiconductor material.

18. The method as claimed in claim 1, wherein the plurality of MEMS structures comprise movable micromirrors.

19. A method for producing micro-electromechanical system (MEMS) components, comprising:
   arranging an adhesive structure on a main surface of a carrier;
   forming a semiconductor wafer having a plurality of MEMS structures arranged near a first main surface of the semiconductor wafer;
   attaching the adhesive structure to the first main surface of the semiconductor wafer, wherein the adhesive structure contacts the MEMS structures;
   singulation of the semiconductor wafer into a plurality of MEMS components by applying a mechanical dicing process such that the semiconductor wafer has a singulated arrangement that includes the plurality of MEMS components;
   after the singulation of the semiconductor wafer, arranging a second main surface of the semiconductor wafer having the singulated arrangement on a tape-and-frame carrier such that the plurality of MEMS components are arranged on the tape-and-frame carrier, wherein the second main surface is located opposite to the first main surface;
   after arranging the second main surface of the semiconductor wafer having the singulated arrangement on the tape-and-frame carrier, removing the carrier and the adhesive structure from the plurality of MEMS components using one or more of a heat treatment or a UV treatment of the adhesive structure; and
   after removing the carrier and the adhesive structure from the plurality of MEMS components:
      arranging the tape-and-frame carrier with the plurality of MEMS components on a wafer chuck;
      arranging an edge of the tape-and-frame carrier on a pretension chuck, wherein the pretension chuck is configured to lift the edge of the tape-and-frame carrier relative to an inner region of the tape-and-frame carrier that is coupled to the wafer chuck; and
      separating an edge region of the semiconductor wafer from the semiconductor wafer such that the edge region of the semiconductor wafer is detached from the tape-and-frame carrier.

20. The method as claimed in claim 19, wherein the mechanical dicing process is applied at the second main surface of the semiconductor wafer located opposite to the first main surface.

21. The method as claimed in claim 19, wherein the main surface of the carrier is substantially planar.

* * * * *